United States Patent
Grodzki

(10) Patent No.: US 9,506,999 B2
(45) Date of Patent: Nov. 29, 2016

(54) METHOD AND MAGNETIC RESONANCE SYSTEM TO GENERATE RAW DATA SETS IN A DOUBLE ECHO ACQUISITION SEQUENCE

(71) Applicant: David Grodzki, Erlangen (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 611 days.

(21) Appl. No.: 14/068,236

(22) Filed: Oct. 31, 2013

(65) Prior Publication Data

US 2014/0117986 A1 May 1, 2014

(30) Foreign Application Priority Data

Oct. 31, 2012 (DE) .................. 10 2012 219 926

(51) Int. Cl.
*G01R 33/48* (2006.01)
*G01R 33/561* (2006.01)

(52) U.S. Cl.
CPC ....... *G01R 33/4816* (2013.01); *G01R 33/5616* (2013.01)

(58) Field of Classification Search
CPC .......... G01R 33/4816; G01R 33/5615; G01R 33/5616
See application file for complete search history.

(56) References Cited

U.S. PATENT DOCUMENTS

| 5,508,612 A * | 4/1996 | Kanazawa ......... G01R 33/5615 324/307 |
| 8,466,679 B2 * | 6/2013 | Takizawa ........... G01R 33/5616 324/309 |
| 2008/0154117 A1 | 6/2008 | Nielles-Vallespin |
| 2010/0268061 A1 | 10/2010 | Porter et al. |
| 2013/0249548 A1 * | 9/2013 | Stemmer ............. G01R 33/543 324/309 |

OTHER PUBLICATIONS

Heid et al., "Rapid Single Point (RASP) Imaging," SMR, 3rd Annual Meeting (1995), p. 684.
Zhang et al., "Real-Time Tracking and Visualization of Regional Lung Motion with Dual Gradient Echo Acquisition," Proc. Intl. Soc. Mag. Reson. Med., vol. 15 (2007), p. 2770.
Du et al., "Short T2 contract with three-dimensional ultrashort echo time imaging," Magnetic Resonance Imaging, vol. 29 (2011), pp. 470-482.

* cited by examiner

*Primary Examiner* — Gregory H Curran
(74) *Attorney, Agent, or Firm* — Schiff Hardin LLP

(57) ABSTRACT

In a method, a magnetic resonance apparatus and non-transitory, a computer-readable storage medium, two raw data sets are created using at least one double-echo acquisition of an imaging area located in a measurement volume of the magnetic resonance apparatus. In the acquisition and storage of two echo signals in the form of raw data sets at different times, a second echo signal is not acquired after each and every radiated RF excitation pulses.

10 Claims, 3 Drawing Sheets

METHOD AND MAGNETIC RESONANCE SYSTEM TO GENERATE RAW DATA SETS IN A DOUBLE ECHO ACQUISITION SEQUENCE

BACKGROUND OF THE INVENTION

1. Field of the Invention

The present invention concerns a method to generate raw data sets from echo acquisitions of magnetic resonance signals, and a corresponding computer-readable data storage medium and a magnetic resonance system that implements such a method.

2. Description of the Prior Art

New fields of use in magnetic resonance tomography are offered by the acquisition of magnetic resonance data (shortened to MR data) with very short echo times TE (for example TE<500 µs. It is thereby possible to depict substances or tissue that cannot be shown by means of conventional sequences—for example a (T)SE ((Turbo Spin Echo) sequence or a GRE (Gradient Echo) sequence)—since their T2 time (the relaxation of the transverse magnetization of this substance or tissue) is markedly shorter than the echo time, and thus a signal or ignition from these substances or tissues has already decayed at the acquisition point in time. For example, with echo times in the range of the corresponding decay time, it is possible to show bones, teeth or ice in an MR image, although the T2 time of these items lies in a range from 30-80 µs.

One approach to enable short echo times is to scan k-space (i.e. make data entries into k-space) in points detected during free induction decay (FID). Such a method is also designated as single point imaging because essentially only one raw data point in k-space is detected per RF excitation. One example of such a method for single point imaging is the RASP method ("Rapid Signal Point (RASP) Imaging", O. Heid, M. Deimling, SMR, 3rd Annual Meeting, Page 684, 1995). According to the RASP method, a raw data point in k-space, whose phase has been coded by gradients, is read out at a fixed point in time after the RF excitation relative to the echo time TE. The gradients are modified by means of the magnetic resonance system for each raw data point or measurement point, and k-space is thus scanned point by point.

To create an image that depicts only substances or tissue which have a very short T2 time (bones, for example), it is typical to implement the RASP method twice, for example, wherein the RASP method operates with such a short echo time TE in the first pass that the bones (for example) still supply a signal, and wherein the RASP method operates with a correspondingly longer echo time TE in the second pass so that the bones no longer deliver a signal. Each pass of the RASP method respectively produces an image, and the two images created in such a manner are subtracted from one another so that only tissues or substances that have a very short T2 time are still shown in the resulting difference image.

SUMMARY OF THE INVENTION

An object of the invention is to optimize the measurement time of echo measurements with very short echo times using at least one double echo sequence, and thus to also optimize the total measurement time to acquire image data sets with a magnetic resonance system.

In the following, the achievement of the object according to the invention is described in relation to the claimed method. Features, advantages or alternative embodiments that are mentioned are likewise applicable to the other aspects of the invention, namely the computer-readable storage medium and the MR apparatus. The corresponding functional features of the method can be formed by corresponding object modules, in particular by hardware modules.

The invention uses different repetition times in order to thus markedly reduce the measurement time of echo measurements with very short echo times using at least one double echo acquisition.

A method is provided that creates two raw data sets by operating a magnetic resonance system using at least one double echo acquisition of an imaging area located in a measurement volume of the magnetic resonance system, by scanning k-space corresponding to the imaging area, and includes the following steps:

a) radiate an RF excitation pulse with an RF transmission/reception device of the magnetic resonance system, b) acquire a first echo signal after a first time period after the radiated excitation pulse with the RF transmission/reception device, and store the first echo signal in the form of a first raw data set, and c) repeat steps a) and b) while activating different gradients for spatial coding with a gradient field system of the magnetic resonance system, until desired k-space has been filled with the first echo signals, and after at least one radiated RF excitation pulse (but not after each and every radiated RF pulse) a second echo signal is acquired after a second time period (that is not identical to the first time period) with the RF transmission/reception device, and is stored in the form of a second raw data set.

In other words, after every radiated RE excitation pulse, there is an acquisition of a first echo signal before the next RF excitation pulse occurs. After some, but not all, of the RF excitation pulses, there is also an acquisition of a second echo signal, before the next RF excitation pulse is radiated. This means that there will be at least one radiated RF pulse after which no second echo signal is acquired before the radiation of the next RF excitation pulse.

By the repetition according to the invention of Step c) of the method described above, it is sufficient to not acquire a second echo signal after each radiated RF excitation pulse. The time up to the creation of the second complete raw data sets can thereby be markedly reduced.

In a preferred embodiment, an image data set is respectively reconstructed from the two raw data sets. The time until an image can be reconstructed is also reduced via the reduction of the measurement time of the echo measurements.

In an embodiment, a difference image is calculated from the two reconstructed image data sets. While signals of nearly all substances and tissues (including bones, teeth and ice) are included in the results which are acquired in the first scanning process, only signals of substances and tissues which have a correspondingly long T2 time are included in the results which are acquired in the second scanning process. Therefore, the difference image includes only those substances and tissues which have such a short T2 time that they are no longer included in the second image. For example, it is possible for only bones to still be shown in the difference image. For this purpose, it is sufficient, for example, for the second scan to occur somewhat more than 400 µs after the RF excitation pulse (thus with an echo time of 400 µs) since the signal of bones has already decayed after this time (400 µs).

Another embodiment according to the invention includes weighting one of the images in the calculation of the difference image, the weighting depends on a time constant prevailing in the imaging area.

In a further embodiment, in chronologically successive repetitions, those repetitions in which precisely one echo signal is acquired alternate with repetitions in which the first echo signal as well as the second echo signal is acquired. It is thereby possible to optimize measurements for specific applications.

In a further preferred embodiment, a first block composed of chronologically successive repetitions includes only repetitions in which the first and second echo signals are acquired, while a second block of chronologically successive repetitions consists only of repetitions in which precisely one echo signal is acquired. In this way it is also possible to optimize measurements for specific applications.

In one suitable application case, after the acquisition of the first echo signal data set the polarities of gradients (Gx, Gy, Gz) are reversed and the second echo signal data set is subsequently acquired.

In a particularly suitable application case, k-space corresponding to the imaging area is scanned along a radial trajectory in a quadrant of k-space for the first raw data set, and along a radial trajectory through the entirety of k-space for the second raw data set.

Within the scope of the present invention, a magnetic resonance system is also provided for the creation of two raw data sets, using at least one double echo sequence, of an imaging area located in a measurement volume of the magnetic resonance system. The magnetic resonance system has a scanner/data acquisition unit with a magnet unit and a gradient field system that respectively generate a magnetic field and a gradient field in the measurement volume, a control unit to control the scanner, a transmission/reception device to receive echo signals and to radiate RF excitation pulses, and an evaluation device to evaluate the signals and create the two raw data sets.

The apparatus is designed to scan k-space corresponding to the imaging area and to implement the following steps:

a) radiate an RF excitation pulse with the RF transmission/reception device of the data acquisition unit, b) acquire a first echo signal after a first time after the radiated excitation pulse with the RF transmission/reception device, and store the first echo signal in the form of a first raw data set and c) repeat steps a) and b) while activating different gradients for spatial coding with the gradient field system until desired k-space has been filled by the first echo signals and, after at least one radiated RF excitation pulse (but not after each and every radiated RF excitation pulse) a second echo signal is acquired after a second period of time (that is not identical to the first period of time) by the RF transmission/reception device, and is stored in the form of a second raw data set.

The present invention also encompasses a non-transitory, computer-readable data storage medium encoded with programming instructions that, when the data storage medium is loaded into a computerized control and evaluation system of a magnetic resonance apparatus, causes the control and evaluation system to operate the magnetic resonance apparatus to execute one or more embodiments of the above-described method. The programming instructions in the non-transitory, computer-readable data storage medium may require program means (for example libraries and auxiliary functions) in order to realize the corresponding embodiments of the method The programming instructions can be source code that must still be compiled and linked or that must only be interpreted, or can be an executable software code that is still to be loaded into the corresponding computer for execution.

The computer-readable storage medium can be, for example, a DVD, a magnetic tape or a USB stick on which is stored electronically readable control information, in particular software. When this control information is read from the data medium and stored in a controller or computer of a magnetic resonance system, all embodiments of the method according to the invention that is described in the preceding can be executed.

The advantages of the magnetic resonance system according to the invention and the computer-readable storage medium according to the invention essentially correspond to the advantages of the method according to the invention.

DESCRIPTION OF THE PREFERRED EMBODIMENTS

Figure 1:
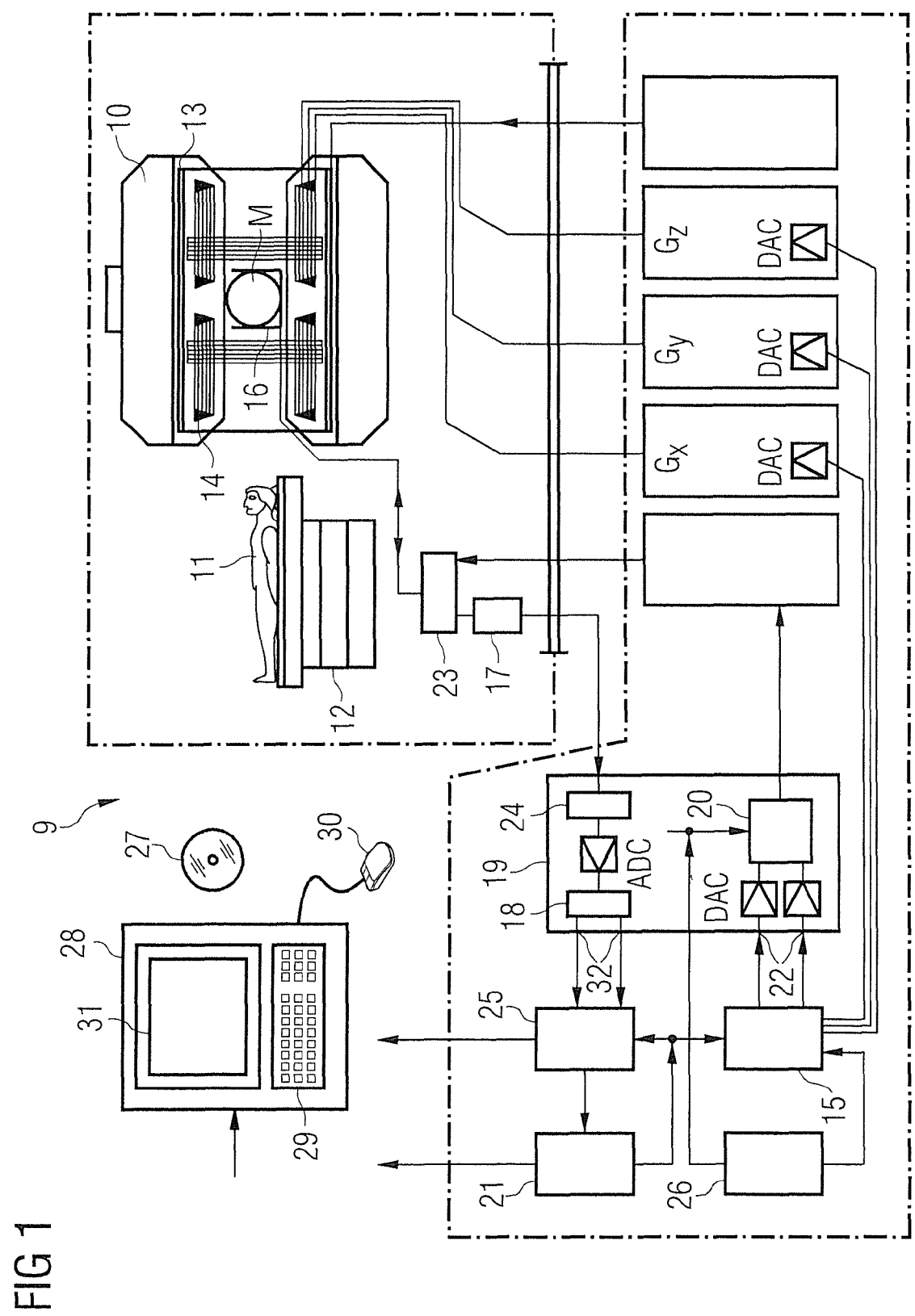
FIG. 1 schematically illustrates a magnetic resonance system according to the invention.

FIG. 1 shows a schematic representation of a magnetic resonance system 9 (of a magnetic resonance imaging or magnetic resonance tomography system). A basic field magnet 10 thereby generates a temporally constant, strong magnetic field for polarization or alignment of the nuclear spins in an examination region of a subject 11 (for example a part of a human body that is to be examined) which, lying on a table 12, is slid into the magnetic resonance system 9. The high homogeneity of the basic magnetic field that is required for the nuclear magnetic resonance measurement is defined in a typically (but not necessarily) spherical measurement volume M in which are arranged the parts of the human body that are to be examined. To support the homogeneity requirements, and in particular to eliminate temporally invariable influences, shim plates made of ferromagnetic material are mounted at a suitable location. Temporally variable influences are eliminated by shim coils 13 if necessary.

In the basic field magnet 10, a cylindrical gradient coil system 14 is used that has three sub-windings. Each sub-winding is supplied by an amplifier with current to generate a linear (also temporally variable) gradient field in the respective direction of the Cartesian coordinate system. The first sub-winding of the gradient field system 14 thereby generates a gradient Gx in the x-direction, the second sub-winding generates a gradient Gy in the y-direction, and the third sub-winding generates a gradient Gz in the z-direction. Each amplifier has a digital/analog converter DAC that is controlled by a sequence controller 15 for accurately-timed generation of gradient pulses.

Located within the gradient field system 14 is at least one radio-frequency antenna 16, which converts the radio-frequency pulses emitted by a radio-frequency power amplifier into an alternating magnetic field for excitation of the nuclei and "tipping" of the nuclear spins of the subject 11 to be examined, or of the region of the subject 11 that is to be examined. Each radio-frequency antenna 16 has one or more RF transmission coils and multiple RF reception coils or, respectively, RF reception antennas in the form of an annular (advantageously linear or matrix-like) arrangement of component coils. The alternating field emanating from the precessing nuclear spins—i.e. normally the spin echo signals caused by a pulse sequence made up of one or more radio-frequency pulses and one or more gradient pulses—is also converted by the RF reception coils of the respective radio-frequency antenna 16 into a voltage (measurement signal), which is supplied via an amplifier 17 to a radio-frequency reception channel 18 of a radio-frequency system 19. The radio-frequency system 22 furthermore has a transmission channel 20 in which the radio-frequency pulses are generated for the excitation of the nuclear spins in order to produce magnetic resonance signals. The respective radio-frequency pulses are digitally represented in the sequence controller 15 as a series of complex numbers based on a pulse sequence predetermined by the apparatus computer 21. This number sequence is supplied as a real part and imaginary part to a digital/analog converter DAC in the radio-frequency system 19 via respective inputs 22, and from the digital/analog converter DAC to a transmission channel 20. In the transmission channel 20, the pulse sequences are modulated on a radio-frequency carrier signal whose base frequency corresponds to the resource frequency of the nuclear spins in the measurement volume.

The switching from transmission operation to reception operation takes place via a transmission/reception diplexer 23. The RF transmission coils of the radio-frequency antenna 16 radiate the radio-frequency pulses for excitation of the nuclear spins into the measurement volume M, and resulting echo signals are scanned via the RF reception coils. The correspondingly acquired magnetic resonance signals are phase-sensitively demodulated to an intermediate frequency in the reception channel 24 (the first demodulator of the radio-frequency system 19) and digitized in an analog/digital converter ADC. This signal is further demodulated to a frequency of zero. The demodulation to a frequency of zero and the separation into real part and imaginary part occur in a second demodulator 18 after the digitization in the digital domain, which second demodulator 18 is connected with an output 32.

An MR image is reconstructed by an image computer 25 from the measurement data acquired in such a manner. The administration of the measurement data, the image data and the control programs takes place via the apparatus computer 21. Based on a specification with control programs, the sequence controller 15 monitors the generation of the respective desired pulse sequences and the corresponding scanning of k-space. In particular, the sequence controller 15 controls the accurately-timed switching of the gradients, the emission of the radio-frequency pulses with defined phase amplitude and the reception of the nuclear magnetic resonance signals. The time base for the radio-frequency system 19 and the sequence controller 15 is provided by a synthesizer 26. The selection of corresponding control programs to generate an MR image (which control programs are stored on a DVD 21, for example), as well as the presentation of the generated MR image, take place via a terminal 28 which includes a keyboard 29, a mouse 30 and a monitor 31.

Figure 2:
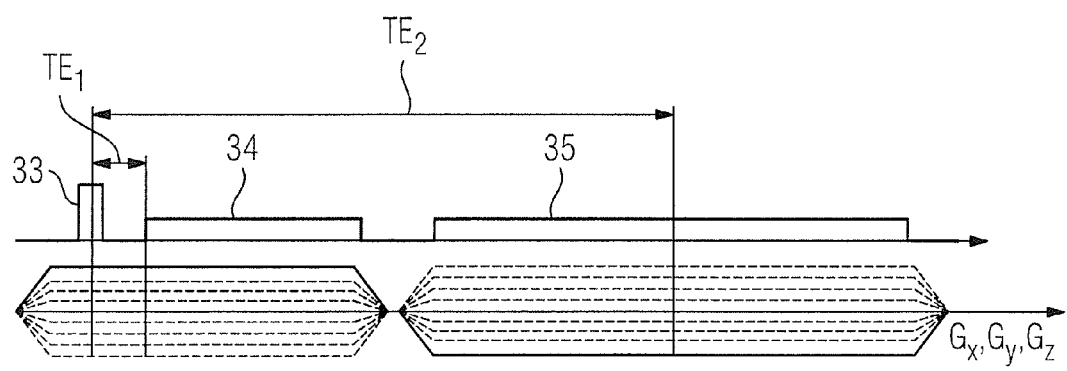
FIG. 2 schematically illustrates the acquisition of a double echo exposure with the PETRA sequence.

FIG. 2 shows a schematic representation for the acquisition of a double echo exposure with the PETRA sequence. After acquisition of the first echo signal 34 after time $TE_1$, the polarity of the gradients is reversed and the second echo signal 35 is acquired after time $TE_2$. The echo signals 34, 35 are stored in the form of raw data sets.

While a half-projection from the center of k-space outward is acquired for the acquisition of the first raw data set, k-space is scanned completely in the acquisition of the second raw data set. The minimum repetition time thus increases by a factor of 2-3 in comparison to an acquisition with only one raw data set.

The number of repetitions corresponds to the number of half-projections that are required in order to completely scan k-space of the first raw data set. K-space of the second raw data set is thereby scanned twice as densely as is actually required.

If a second echo signal 35, which has the result of a minimum repetition time for two echo signals $TE_2$ is now acquired not in every repetition but rather only in a portion of all repetitions, the total measurement time thereby markedly decreases since parts of the measurement can now be measured with the minimum repetition time for an echo $TE_1$.

For example, if a second echo signal 35 is acquired in 50% of all repetitions, the measurement time for the acquisition of the two raw data sets decreases by a factor of two $(0.5*TE_1+0.5*TE_2)$.

In the exemplary embodiment shown in FIG. 2, the gradients $G_x$, $G_y$, $G_z$ are switched before the RF excitation pulse 33 is radiated. This is characteristic of the described PETRA sequence and is not a requirement of the method according to the invention.

Figure 3:
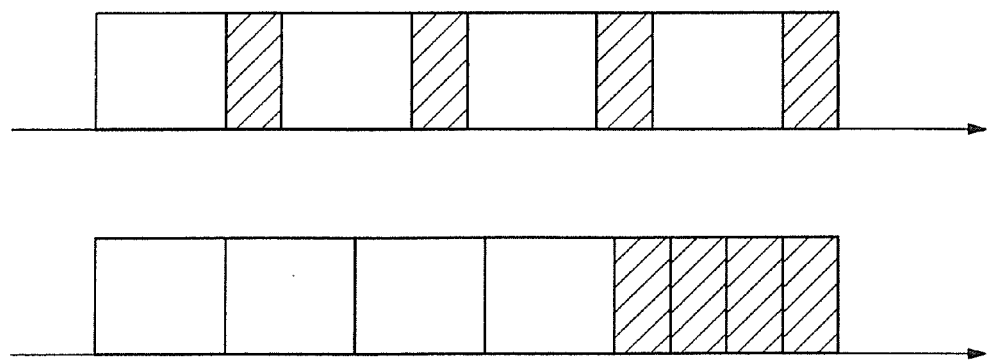
FIG. 3 shows two different sequences of repetitions suitable for the creation of two raw data sets.

FIG. 3 shows two different sequences of possible repetitions for scanning k-space corresponding to an imaging area to create two raw data sets.

Repetitions in which precisely one echo signal 34 is acquired and repetitions in which the first and second echo signal 34, 35 are acquired alternate in the upper example (see FIG. 2 for reference characters).

In the lower example, a first block of chronological repetitions comprises repetitions in which the first and second echo signal 34, 35 are acquired while a second block of chronological repetitions merely comprises repetitions in which precisely one echo signal 34 is acquired. Measurements can thus be optimized for specific applications.

Figure 4:
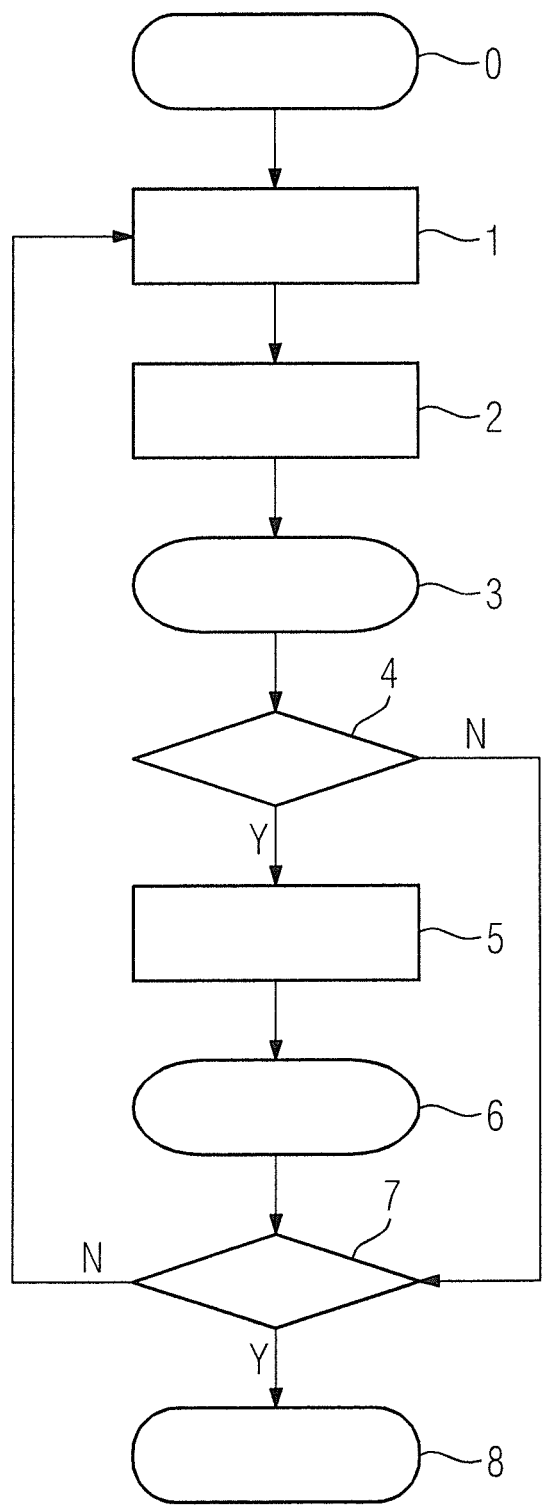
FIG. 4 is a flowchart of an embodiment of the method according to the invention.

FIG. 4 shows a flow diagram of a method according to the invention. The method includes method steps 0 through 8, wherein specification passages including the corresponding reference characters already introduced in connection with FIG. 2 are also used in the description of the method steps 0 through 8.

The scan process is started in method step 0 and an RF excitation pulse 33 is radiated during method step 1.

After a first time $TE_1$ after the radiated excitation pulse 33, in method step 2 the first echo signal 34 is acquired by the RF transmission/reception device and stored in the form of a first raw data set 3.

A query (according to a rule established a priori) as to whether an acquisition of a second echo signal 35 is desired takes place in method step 4. If a second echo signal 35 should be acquired according to the rule (Case Y), in method step 5 this second echo signal 35 is acquired after a second time $TE_2$ (that is not the same as the first time $TE_1$) and stored in the form of a second raw data set 6; otherwise (case N), the method continues in method step 7.

In method step 7, a check is made as to whether the canning of desired k-space corresponding to the imaging area is complete. If the scanning is complete (Case Y), the end 8 of the scanning process has been reached; otherwise (Case N), the method continues at method step 1.

In summary, the invention concerns a method, a magnetic resonance apparatus, and a non-transitory, computer-readable data storage medium for the creation of two raw data sets using at least one double echo acquisition of an imaging area located in a measurement volume of the magnetic resonance apparatus. In the acquisition and the storage of two echo signals in the form of raw data sets at different times, a second echo signal is not acquired after each and every radiated RF excitation pulses.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to generate two raw data sets with a double echo acquisition sequence in a magnetic resonance apparatus, comprising:
   (a) operating a transmission/reception device of a magnetic resonance data acquisition unit to radiate an RF excitation pulse into an imaging area of a subject in the data acquisition unit;
   (b) operating the RF transmission/reception device to acquire a first echo signal after a first time period following the radiated RF excitation pulse, and before radiation of another RF excitation pulse, and storing the first echo signal in an electronic memory organized as k-space;
   (c) repeating (a) and (b) while operating a gradient field system of the data acquisition unit to activate different gradients respectively in the repetitions to spatial code the first echo signals until an entirety of k-space is filled in said electronic memory, thereby producing a first raw data set, representing said first echo signals, in said electronic memory and, in at least one repetition of (a) and (b), but not in each and every repetition of (a) and (b), operating said RF transmission/reception device in at least one repetition of (a) and (b), but not in each and every repetition of (a) and (b), to acquire a second echo signal after a second time period, which is not identical to said first time period, following said RF excitation pulse, and entering said echo signals into said electronic memory to generate a second raw data set in said electronic memory; and
   (d) making said first and second raw data sets available from said electronic memory in a form for further processing thereof.

2. A method as claimed in claim 1 comprising, in a computer, reconstructing a first set of image data from said first raw data set and reconstructing a second set of image data from said second raw data set.

3. A method as claimed in claim 2 comprising, in said processor, calculating a difference image from said first and second image data sets.

4. A method as claimed in claim 3 comprising calculating said difference image by weighting at least one of said first and second image data sets dependent on a time constant that prevails in said imaging area during acquisition of said first and second raw data sets.

5. A method as claimed in claim 1 comprising, in a plurality of chronologically successive repetitions of (a) and (b), alternating repetitions in which only said first echo signal is acquired with repetitions in which said first echo signal and said second echo signal are acquired.

6. A method as claimed in claim 1 comprising repeating (a) and (b) as a first block of chronologically successive repetitions consisting of repetitions in which said first echo signal and said second echo signal are acquired, and a second block of chronologically successive repetitions consisting only of repetitions in which only said first echo signal is acquired.

7. A method as claimed in claim 1 comprising, in the repetitions of (a) and (b), after acquiring said first raw data set, switching respective polarities of the gradients in the respective repetition before acquiring the second raw data set in that repetition.

8. A method as claimed in claim 1 comprising entering said first raw data set along a radial trajectory in a quadrant of k-space, and entering said second raw data set along a radial trajectory proceeding through an entirety of k-space.

9. A magnetic resonance apparatus comprising:
   a magnetic resonance data acquisition unit comprising an RF transmission/reception unit and a gradient field system, and a control unit;
   said control unit being configured to (a) operate the transmission/reception device of a magnetic resonance data acquisition unit to radiate an RF excitation pulse into an imaging area of a subject in the data acquisition unit;
   said control unit being configured to (b) operate the RF transmission/reception device to acquire a first echo signal after a first time period following the radiated RF excitation pulse, and before radiation of another RF excitation pulse, and store the first echo signal in an electronic memory organized as k-space;
   said control unit being configured to (c) repeat (a) and (b) while operating the gradient field system of the data acquisition unit to activate different gradients respectively in the repetitions to spatial code the first echo signals until an entirety of k-space is filled in said electronic memory, thereby producing a first raw data set, representing said first echo signals, in said electronic memory and, in at least one repetition of (a) and (b), but not in each and every repetition of (a) and (b), operate said RF transmission/reception device in at least one repetition of (a) and (b), but not in each and every repetition of (a) and (b), to acquire a second echo signal after a second time period, which is not identical to said first time period, following said RF excitation pulse, and enter said echo signals into said electronic memory to generate a second raw data set in said electronic memory; and
   said control unit being configured to (d) make said first and second raw data sets available from said electronic memory in a form for further processing thereof.

10. A non-transitory, computer-readable data storage medium encoded with programming instructions, said storage medium being loaded into a computerized control and evaluation system of a magnetic resonance apparatus, that also comprises a data acquisition unit having an RF transmission/reception system and a gradient field system, said programming instructions causing said computerized control and evaluation system to:
   (a) operate the transmission/reception device of a magnetic resonance data acquisition unit to radiate an RF excitation pulse into an imaging area of a subject in the data acquisition unit;
   (b) operate the RF transmission/reception device to acquire a first echo signal after a first time period following the radiated RF excitation pulse, and before radiation of another RF excitation pulse, and store the first echo signal in an electronic memory organized as k-space;
   (c) repeat (a) and (b) while operating the gradient field system of the data acquisition unit to activate different gradients respectively in the repetitions to spatial code the first echo signals until an entirety of k-space is filled in said electronic memory, thereby producing a first raw data set, representing said first echo signals, in said electronic memory and, in at least one repetition of (a) and (b), but not in each and every repetition of (a) and (b), operate said RF transmission/reception device in at least one repetition of (a) and (b), but not in each and every repetition of (a) and (b), to acquire a second echo signal after a second time period, which is not identical to said first time period, following said RF excitation pulse, and enter said echo signals into said electronic memory to generate a second raw data set in said electronic memory; and (d) make said first and second raw data sets available from said electronic memory in a form for further processing thereof.

* * * * *